United States Patent [19]

Kaufman et al.

[11] Patent Number: 4,481,062
[45] Date of Patent: Nov. 6, 1984

[54] ELECTRON BOMBARDMENT ION SOURCES

[76] Inventors: Harold R. Kaufman, 401 Spinnaker La., Fort Collins, Colo. 80525; Raymond S. Robinson, 2612 Bradbury Ct., Fort Collins, Colo. 80521; William E. Hughes, 7845 Heritage Dr., Annandale, Va. 22003

[21] Appl. No.: 577,833

[22] Filed: Feb. 7, 1984

Related U.S. Application Data

[63] Continuation of Ser. No. 414,062, Sep. 2, 1982, abandoned.

[51] Int. Cl.³ .............................................. C23C 15/00
[52] U.S. Cl. .................................... 156/345; 204/298; 250/423 R; 313/359.1; 313/360.1; 313/361.1; 313/362.1; 313/363.1
[58] Field of Search ........................ 156/345; 204/298; 250/423 R, 492.3; 313/359.1, 360.1, 361.1, 362.1, 363.1

[56] References Cited

U.S. PATENT DOCUMENTS

| | | | |
|---|---|---|---|
| 4,377,773 | 3/1983 | Herschovitch et al. | 250/423 R |
| 4,383,177 | 5/1983 | Keller et al. | 250/423 R |
| 4,446,403 | 5/1984 | Cuomo et al. | 250/423 R |

OTHER PUBLICATIONS

Crow et al., "High Performance . . . Source" IEEE Transactions on Plasma Science, vol. PS-6, No. 4 (12/1978) pp. 535-538.

Primary Examiner—Jerome Massie

[57] ABSTRACT

An electron-bombardment ion source includes means defining a chamber for containing an ionizable gas together with means for introducing such gas into that chamber. Disposed therein is an anode and an electron-emissive cathode. The potential impressed between the anode and the cathode to effect electron emission at a sufficient velocity to ionize the gas. Also included are means for accelerating ions out of the chamber together with means for establishing a magnetic field within the chamber that increases the efficiency of ionization of the gas by the electrons. Mounted within the chamber is an anode of non-magnetic material that defines an essentially continuous and smooth surface which encloses substantially all of the volume within which the ionization occurs except the exit for the accelerated ions out of the chamber. The entire design is such as to ensure ready removability of the different components for quick and easy cleaning.

6 Claims, 7 Drawing Figures

ELECTRON BOMBARDMENT ION SOURCES

This is a continuation of prior U.S. co-pending application Ser. No. 414,062, filed Sept. 2, 1982, now abandoned.

The present invention pertains to electron-bombardment ion sources. More particularly, it relates to such sources that improve plasma containment.

Electron-bombardment ion sources originally were developed as a means of propulsion in outer space. U.S. Pat. No. 3,156,090 is exemplary. Additional discussion is contained in an article titled "Technology of Electron-Bombardment Ion Thrusters", by H. R. Kaufman, which appeared in *Advances in Electronics and Electron Physics*, Volume 36, L. Marton, ed., Academic Press, New York, pp. 265-373 (1974).

Electron-bombardment ion sources have now also found use in the field of sputter etching and deposition. In sputter etching, the ion beam produced by the source is directed against the target, so as to result in the removal of material from the target. By protecting chosen portions of the target from the ions, material effectively may be removed from the other portions of that target. That is, selective machining of different portions of the target is achieved.

Alternatively, the same kind of ion source can be used for sputter deposition. In this case, the surface to be coated is disposed in a position to face the ion-beam target. In operation, the surface receives the material eroded from the target. Selected portions of the surface under treatment may be masked so that the sputter material is deposited in accordance with a chosen pattern. Moreover, several different targets may be ionically bombarded simultaneously. This results in a controlled deposition of alloys of different materials. In some cases, sputter deposition represents the only known way in which the formation and deposit of such alloys may be achieved.

Still another use of such ion sources is in the implantation or doping of ions into a semiconductor material. Basically, this usage differs from sputter machining only in that higher energies are required to obtain a useful distance of penetration into the semiconductor material.

The technology behind electron-bombardment ion sources intended specifically for sputter etching and deposition is described in "Technology of Ion Beam Sources Used in Sputtering", *J. Vac. Sci. Technol.*, Vol. 15, March/April 1978., and in "Ion Source Design for Industrial Applications", *AIAA*, Paper No. 81-0668, April 1981.

Ion sources of this sort includes a chamber into which an ionizable gas, such as Argon, is introduced. An anode within the chamber attracts high-velocity electrons emitted from a cathode. Impingement of the electrons upon the gas atoms results in ionization of the gas. At one end of the chamber usually is an apertured screen grid followed by an an apertured accelerator grid. A potential impressed on the accelerator grid causes the ions to be drawn out of the chamber through the apertures in both grids. The apertures in both grids usually are aligned, so that the accelerator grid is shielded from direct ionic bombardment.

At least usually, another electron-emissive cathode is disposed beyond the accelerator grid for the purpose of effecting neutralization of the electric space charge otherwise exhibited by the accelerated ion beam. Preferably, the interior of the ion chamber is subjected to a magnetic field which causes the electrons emitted from the cathode to gyrate in their travel toward the anode. This gyration greatly increases the possibility of an ionizing collision between any given electron and the ionizable gas atoms, resulting in a substantially increased efficiency of ionization.

Prior approaches for electron-embardment ion sources used in sputter etching and deposition include that which is described in U.S. Pat. Nos. 3,913,320, 3,952,228, 3,956,666 and 3,969,646. For purposes of illustration and explanation, descriptions from the latter are included herein, as a result of which, they are expressly incorporated herein by cross-reference.

A common problem encountered with such prior electron-bombardment ion soures, used in sputter etching and deposition, is a contamination of both the ion source and the surfaces under treatment. The potential difference established between the anode and cathode surfaces in the ion chamber is sufficient to result in sputtering of material from the cathode surfaces by the ions produced. Those portions of the cathode surfaces that are aligned, line of sight visibility, so as to be "seen" from outside the ion chamber, can contribute to the contamination of the surface under treatment. Ions that strike the anode surfaces have less energy, so that sputtering of those surfaces is not a problem. Instead, it is the accumulation of sputter material on the anode surfaces, either from the cathode within the chamber or from the surface of surfaces being treated, that creates the problem.

When the accumulation is non-conductive and is allowed to continue sufficiently long, ion source operation will be impaired and may even cease. Even when the coating is conductive, sufficient accumulation may result in cracking or peeling of that accumulation. Moreover, dislodged pieces of the accumulation can result in contamination of the surfaces being processed, and it may even result in a shorting as between various ion source electrodes.

The contamination of the surfaces being treated is customarily reduced by using a well collimated ion beam and a large spacing between the ion source and the treated surfaces. Sputter contamination from the ion source, being non-collimated, is reduced as a result of the large spacing. However, contamination of the ionization chamber, either from cathode surfaces within the chamber or from the surfaces being treated, results in the need for cleaning. In at least some sputtering applications, the need for cleaning is frequent. The chamber designs usually used have a plurality of surface configurations not readily accessible for such cleaning. In consequence, the cleaning operation can be difficult and time consuming.

In seeking to optimize the use of a magnetic field for attaining maximum ionization, numerous suggestions have been made with regard to the distribution within the ion chamber of a multiplicity of suitably polarized magnetic pole pieces. That is, a plurality of magnetic pole pieces are distributed around the ion chamber and either interspersed or intermixed with a similar plurality of small anode sections. In some such arrangements, the magnetic field, which is established near the walls of the ion chamber, prevents electron travel directly to the anodes. This type of multipole approach was described by R. David Moore in *AIAA* Paper No. 69-260 under the title of "Magneto-Electrostatically Contained Plasma Ion Thruster" and presented in March of 1969. It also was described by William B. Ramsey in a paper entitled "12-cm Magneto-Electrostatic Containment Mercury Ion Thruster Development" which appeared in J. Spacecraft and Rockets Vol. 9, No. 5, for May 1972 (J. Spacecraft).

There have been variations of the original multipole approach. In particular, a plasma containment approach was proposed by Linpaecher and McKenzie in "Magnetic Multipole Containment of Large Uniform Collisionless Quiescent Plasmas", Rev. Sci. Instrum., Vol. 44, No. 6, June 1973. That illustrated that it was possible for energetic electrons to escape directly to the anode surface without crossing magnetic fields, but that the probability of electrons doing so is small due to the strength of the magnetic field and the arrangement of a large plurality of magnetic elements.

Ion chambers that use anode surfaces which can be reached directly, without crossing magnetic field lines, by energetic electrons are described in the aforesaid U.S. Pat. No. 3,969,646. Plasma confinement also is a subject of the article titled "High Performance, Low Energy Ion Source" by Crow et al. which appeared in IEEE Transactions on Plasma Science, Vol. PS-6, No. 4, December 1978. Crow et al suggest the use of a continuous anode shell composed of copper which is placed inside the magnetic structure and is in contact with that structure. Its purpose is for the mounting of cooling coils. Crow et al include a definition of a plurality of grooves milled into the interior surface of their anode. Those grooves are particularly subject to contamination and are very difficult to clean. Moreover, the structural arrangement in that proposal does not allow for easy dismantling for cleaning.

Other references of background interest include an article entitled "Etude D'une Source d'Ions de Basse Energie et a Forte Densite de Courant", which appeared in Revue de Physique Appliquef, Tome 6, Stembre 1971 beginning at page 325, "A Labortory Simulation of Ionospheric Plasma", which appeared in *AIAA Journal*, Vol. 11, No. 2, February 1973, pp. 120–130 and U.S. Pat. No. 4,259,145 to Harper et al.

It is a general object of the present invention to provide an electron-bombardment ion source with an improved ion chamber that overcomes disadvantages or deficiencies present in any one or more of the previously described systems.

A specific object of the present invention is to provide a new ion chamber approach which eliminates or at least minimizes the sputter erosion that takes place within the ion chamber, thereby eliminating or minimizing the contamination of the surfaces being treated by the ion source.

Another object of the invention is to provide an ion chamber design that is quickly and conveniently cleaned, thereby minimizing the time and expense involved in such cleaning.

In achieving all of the foregoing objectives, it is also an aim to provide a new and improved chamber which produces an extremely uniform ion beam.

As constructed in accordance with the present invention, an electron-bombardment ion source has a chamber into which an ionizable gas is introduced. Disposed within the chamber are an anode and an electron-emissive cathode across which a potential is impressed to effect electron emission at a sufficient velocity to ionize the gas. Also included are means for accelerating ions out of the chamber and means for establishing a magnetic field within the chamber which increases the efficiency of ionization of the gas by the electrons.

As an improvement, the anode is constructed of a non-magnetic material and defines an essentially continuous and smooth surface which encloses substantially all of the volume within which the ionization occurs except for the exit of the accelerated ions out of the chamber. The means which establishes the magnetic field is located exteriorly to that anode. The anode is constructed so as to be readily removable in order to enable cleaning. The surface of the anode on its interior exhibits a smooth contour which is devoid of any portion physically shielded from ready accessibility.

The features of the present invention which are believed to be patentable are set forth with particularity in the appended claims.

The invention, together with further objects and advantages thereof, may best be understood by reference to the following description taken in connection with the accompanying drawings, in the several figures of which like reference numerals identify like elements and in which.

Figure 1:
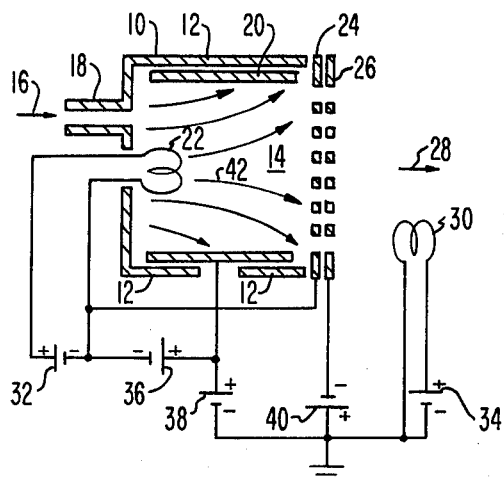
FIG. 1 is a schematic diagram of a known divergent-field electron-bombardment ion source together with its associated circuitry.

In order to gain a better understanding of the subject matter, a rather full explanation will first be given with respect to the nature and operation of a typical known electron-bombardment ion source of the divergent-field type which is illustrated in FIG. 1. It will initially be observed that FIG. 1, like all others of the figures, is set forth generally in schematic form. The actual physical structure of the apparatus may of course vary but a suitable and workable example of physical implementation, subject to the changes to be described further herein, is that disclosed in the aforesaid U.S. Pat. No. 3,156,090, which patent, therefore, is expressly incorporated herein by reference. Thus, housing 10 is in the form of a cylindrical metallic shell 12 that circumscribes and defines a chamber 14 in which a ionizable gas, such as argon, is to be contained. As indicated by the arrow 16, the gas is introduced into one end of shell 12 through a manifold 18. Disposed symmetrically within shell 12 is a cylindrical anode 20. Centrally positioned within anode 20 is a cathode 22.

In the vicinity of the end of shell 12, opposite that in which, in this case, manifold 18 is located, is an apertured screen grid 24. Spaced beyond screen grid 24 is an apertured accelerator grid 26. The apertures in screen grid 24 are aligned with the apertures in accelerator grid 26 so that the solid portions of the accelerator grid 26 are shielded from bombardment of ions that are withdrawn from chamber 14 through screen grid 24 and accelerator grid 26, so as to proceed along a beam path indicated by arrow 28. Situated beyond accelerator grid 26 from chamber 14 is a neutralization cathode 30.

As herein incorporated, cathodes 22 and 30 are each formed of a refractory metal filament such as tantalum or tungsten wire. The opposite ends of the cathodes are individually connected across respective energizing sources 32 and 34. Sources 32 and 34 may deliver either direct or alternating current. Other types of cathodes, such as a hollow cathode which, during normal operation, requires no heating current, may be substituted. For creating and sustaining electron emission from cathode 22, a direct-current source 36 is connected with its negative terminal to cathode 22 and its positive terminal to anode 20. Connected with its positive terminal to anode 20 and its negative terminal returned to system ground, as indicated, is a main power source 38 of direct current. Another direct-current source 40 has its negative terminal connected to accelerator grid 26 and its positive terminal returned to system ground. Finally one side of neutralizing cathode 30 also is returned to ground. (For an alternating current energizing source, the center tap of the energizing transformer winding can be returned to system ground.) Completing the energizing arrangements, screen grid 24 is in this case connected to one side of cathode 22.

Figure 2:
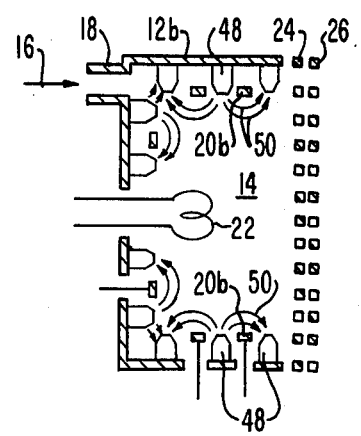
FIG. 2 is a fragmentary schematic diagram of a known multipole electron-bombardment ion source.

Overall, the operation of the system of FIG. 2 is essentially similar to that already described with respect to the divergent-field ion source of FIG. 1. The significant difference in FIG. 2 is that the magnetic field strength is comparatively small over most of the volume defined by chamber 14. Consequently, the electrons emitted from cathode 22 are extremely well distributed over the interior of chamber 14, as a result of which the profile of the ion beam obtained is quite uniform.

Figure 3:
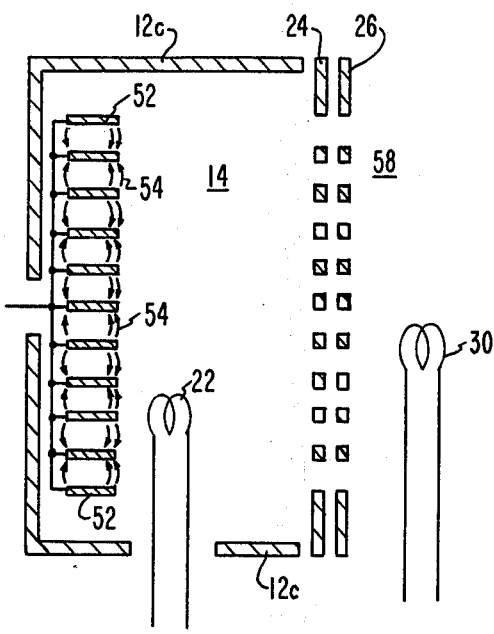
FIG. 3 is a fragmentary diagram of another version of a multipole electron-bombardment ion source.

Turning next to FIG. 3, the general principle of operation is still the same. A shell 12c defines ion chamber 14 at one end of which are screen grid 24 and accelerator grid 26. Beyond chamber 14 from accelerator grid 26 is the usual neutralizing cathode 30. Suitable arrangements for energizing different components, including the anode, cathode 22, screen grid 24, accelerator grid 26 and cathode 30 are the same as that already described in detail with respect to the system of FIG. 1. Moreover, the typical parameter values exemplified with respect to the system of FIG. 1 are once again applicable.

In the case of FIG. 3, the anode is composed of a plurality of successively spaced segments 52 that, as shown, are distributed within chamber 14 along the wall thereof opposite screen grid 24. In an extension of this approach, segments 52 may also be distributed along all of the walls of chamber 12c except immediately in front of screen 24. Each of segments 52 is fabricated of a magnetic material that also is electrically conductive. The different ones of segments 52 are interconnected so as collectively to constitute the overall anode. Moreover, individually adjacent ones of segments 52 respectively are oppositely polarized magnetically as a result of which segments 52 collectively serve to establish the magnetic field within chamber 14. In consequence, the produced magnetic field lines 54 are confined essentially to the successive regions immediately between the respective different ones of segments 52. In operation, the arrangement of the system of FIG. 3 is such that the end edge portion of each of strips 52, facing screen 24, is exposed for the receipt of electrons that need not cross the magnetic field lines.

In, perhaps, a most direct approach, each of anode segments 52 is in itself a permanent magnet, or more completely a respective pole of a permanent magnet. Seemingly more practical, however, each of segments 52 is in itself composed of a strip of magnetizable material. In turn, each successive pair of such strips may be spaced apart by respective individual magnets. In a specific configuration of the latter arrangement, each of segments 52 is a flat strip of mild steel twelve millimeters wide and 1.5 millimeters thick. The successive strips are spaced apart by a distance of twelve millimeters through the use of cylindrical permanent magnets that are 6 millimeters in diameter and, of course, 12 millimeters long. A sufficient number of such magnets are utilized in order to obtain a field strength of fifty Gauss as measured on the center line of the strips.

It will be observed that the subject matter so far discussed has already been described collectively in the aforesaid U.S. Pat. Nos. 3,956,666, 3,952,228, 3,913,320 and 3,969,646. Incorporation of those references herein by reference serves to provide further background and understanding as well as to suggest various details and alternatives that may be included. In any event, the foregoing background serves not only as an aid in understanding the overall principles of operation but also as a basis of comparison.

Figure 4:
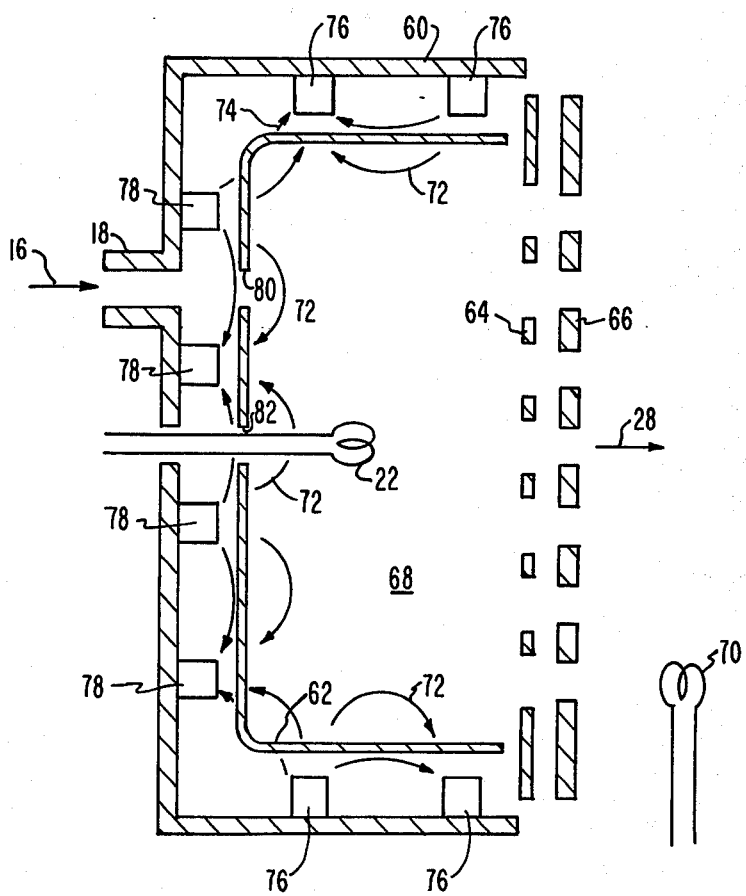
FIG. 4 is a fragmentary diagram of an electron-bombardment ion source constructed in accordance with one embodiment of the present invention.

Directing attention now to FIG. 4, an ion source includes a shell 60 which, once again, provides for containment of the ionizable gas. Within shell 60 is an anode 62 associated with a screen grid 64 and an accelerator grid 66. Beyond the chamber 68 defined by shell 60 and within anode 62, and spaced outwardly from accelerator grid 66, is a neutralizing cathode 70. The supply of power and the manner of circuitry for energizing all of these different components just discussed is the same as that previously described with regard to FIG. 1. Moreover, the typical parameter values exemplified for that system of FIG. 1 are generally applicable to the system of FIG. 4.

An exception resides in the strength of the magnetic field. In the case of FIG. 4, it is stronger, because it is concentrated near anode 62, rather than being distributed more uniformly over the entire volume of chamber 68. The principal magnetic field lines are illustrated in FIG. 4 by arrows 72 on the interior side of anode 62 and by arrows 74 that extend directly between a distributed plurality of pole pieces 76 and 78 distributed around the interior wall of shell 60 and individually of respective alternate polarity and progressing around that interior surface of shell 60. Typical values for the strength of the magnetic field near anode 62 range from fifty to several-hundred Gauss.

Anode 62 is of a non-magnetic material such as copper or stainless steel. It defines an essentially-continuous surface that encloses substantially all of the volume within which ionization occurs, except, of course, the area of exit for the acceleration of the ions out of chamber 68 and through grids 64 and 66. Only very small openings are provided in the wall of anode 62, as at aperture 80 for admitting the gas from inlet 18 and an aperture 82 for the purpose of allowing entrance of the leads to cathode 22. The function of apertures 80 and 82 could be combined into one opening or the leads to cathode 22 might be led through insulating seals.

It will be observed that anode 62 is, in a sense, its own shell that is nested within magnets 76 and 78 and outer shell 60. Anode 62 is physically and thermo-conductively separated and spaced inside pole pieces 76 and 78; such spacing minimizes heat transfer. Normally, grids 64 and 66 are attached to shell 60 so as to be stretched across its opening. In an alternative, grids 64 and 66 may be attached to the forward opening defined by anode 62.

The manner of mounting anode 62 within shell 60 is subject to a wide degree of variation. In any case, it is to be quickly demountable. In addition, it is preferred that the peripherally-encompassing sidewall 86 of shell 60 be also easily removable from end wall 88 of shell 60. As an alternative, the anode can be exposed by making the grids 64 and 66 demountable from sidewall 86. Inasmuch as the alignment and spacing one from the other of grids 64 and 66 are critical, frequent demounting of the grids is often undesirable. A suitable connection can be made for either demounting approach by way of screws, bolts or so-called quick-disconnect fastening devices.

Figure 5:
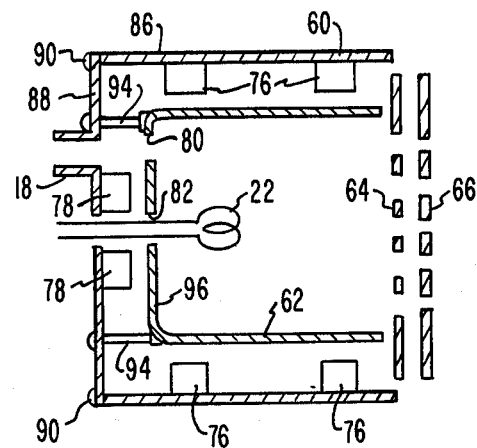
FIG. 5 is a similar schematic diagram of an ion source similar to that shown in FIG. 4, but including a representation of certain mounting elements.

FIG. 5 depicts a version of the ion source which is similar to that shown in FIG. 4. Sidewall 86 is, in this case, fastened in place by the simple means of bolts 90. Within shell 60, anode 62 is stably suspended and supported by means of insulated and non-magnetic studbolts 94 that extend between the inner endwall 96 of anode 62 and endwall 88.

Figure 6:
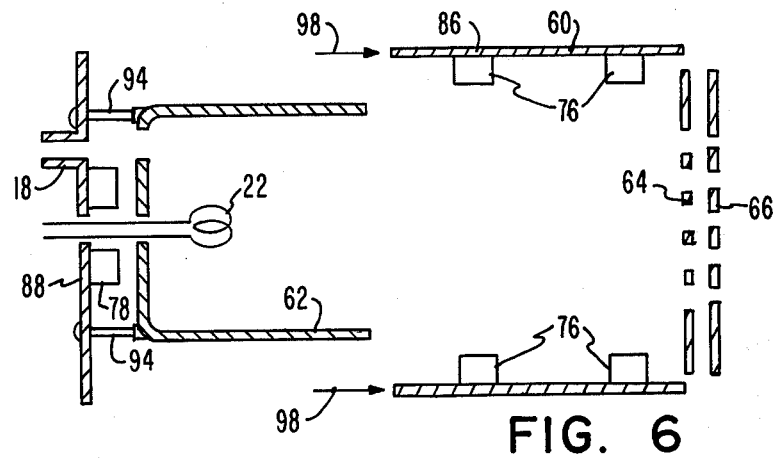
FIG. 6 is a diagram of the assembly of FIG. 5 but with certain of the components pulled apart.
Figure 7:
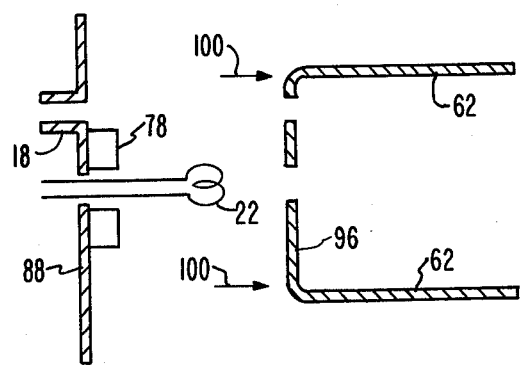
FIG. 7 is a view of a portion of that which is shown in FIG. 6 but with further disassembly of components.

Such an arrangement makes it extremely easy for the unit to be disassembled and cleaned in order to avoid the problems mentioned in the introduction. That is, FIG. 5 represents the ion source as completely assembled. In FIG. 6, bolts 90 have been removed and the combination of sidewall 86 and grids 64 and 66 has been pulled in the direction of arrows 98. Thereafter, studbolts 94 are removed and anode 62 is withdrawn from endwall 88 along the direction indicated by arrows 100 in FIG. 7.

Whatever specific manner of support is employed for mounting anode 62 within the shell 60, and also grids 64 and 66, it is to allow quick disassembly for savings on downtime. In addition, the smooth, essentially continuous interior and exterior of anode 62 allows it to be quickly cleaned of collected contaminants and anything else. Moreover, that smooth interior surface of anode 62 ensures against the collection of an unwanted deposits because of the absence of crevices, undercuts or grooves. Thus, the forms of device herein disclosed enable the adaptation of any or all of the improvements discussed in the prior art up to this point, and yet results in a product which is capable of increased durability and on time usage relative to the downtime for maintenance.

While particular embodiments of the invention have been shown and described, and alternatives have been suggested, it will be obvious to those skilled in the art that changes and modifications may be made without departing from the invention in its broader aspects. Therefore, the aim in the appended claims is to cover all such changes and modifications as fall within the true spirit and scope of that which is patentable.

We claim:

1. In an ion source which includes:
   means defining a chamber of conductive material for containing an ionizable gas within said chamber;
   an anode disposed within said chamber;
   an electron-emissive cathode disposed within said chamber;
   means for effecting electron emission at a sufficient velocity to ionize said gas;
   means for accelerating ions out of said chamber;
   and means for establishing a magnetic field within such chamber to increase the efficiency of ionization of said gas by said electrons;
   the improvement comprising:
   said anode being conductive and of non-magnetic material and defining an essentially-continuous and smooth surface including substantially all of the volume within which said ionization occurs except for the exit for accelerated ions out of said chamber;
   means for mounting said anode within and electrically insulating said anode from said chamber;
   and said establishing means being located exteriorly of said anode.

2. An ion source as defined in claim 1 in which said mounting means enables quick demountability of said anode from within said chamber without demounting said accelerating means.

3. An ion source as defined in claim 2 in which said chamber is defined by a shell and in which said shell includes an endwall and a sidewall removably secured to said endwall.

4. An ion source as defined in claim 3 in which said accelerating means is attached to said sidewall.

5. An ion source as defined in claim 1 in which the interior of said anode exhibits a smooth surface devoid of any portion physically shielded from ready accessibility.

6. An ion source as defined in claim 3 in which said establishing means is composed of a plurality of magnetic pole pieces distributed around and affixed to the interior of said shell.

* * * * *